(12) United States Patent
Cowley

(10) Patent No.: US 6,954,625 B2
(45) Date of Patent: Oct. 11, 2005

(54) TUNER AND METHOD OF ALIGNING A TUNER

(75) Inventor: Nicholas Paul Cowley, Wroughton (GB)

(73) Assignee: Zarlink Semiconductor Limited (GB)

( * ) Notice: Subject to any disclaimer, the term of this patent is extended or adjusted under 35 U.S.C. 154(b) by 501 days.

(21) Appl. No.: 10/133,601

(22) Filed: Apr. 26, 2002

(65) Prior Publication Data
US 2002/0177423 A1 Nov. 28, 2002

(30) Foreign Application Priority Data
Apr. 28, 2001 (GB) ............................................. 0110497

(51) Int. Cl.$^7$ ................................................. H04B 1/06
(52) U.S. Cl. ................. 455/259; 455/183.2; 455/192.2; 455/255
(58) Field of Search ........................ 455/161.1, 161.2, 455/161.3, 164.1, 165.1, 173.1, 176.1, 177.1, 180.3, 182.1, 182.2, 182.3, 183.1, 183.2, 192.1, 192.2, 255, 256, 257, 258, 259, 260, 340

(56) References Cited

U.S. PATENT DOCUMENTS

| 4,736,456 A | 4/1988 | Maier |
| 4,932,072 A | * 6/1990 | Toko ........................ 455/183.2 |
| 4,956,711 A | 9/1990 | Maier |
| 6,067,332 A | * 5/2000 | Taura et al. ............. 455/192.2 |
| 2002/0054651 A1 | * 5/2002 | Posti .......................... 375/316 |

FOREIGN PATENT DOCUMENTS

| GB | 2205460 A | 12/1988 |
| GB | 2244877 A | 12/1991 |
| GB | 2344710 A | 6/2000 |

* cited by examiner

Primary Examiner—Sonny Trinh
Assistant Examiner—Sam Bhattacharya
(74) Attorney, Agent, or Firm—Thompson Hine LLP

(57) ABSTRACT

A tuner comprises a first frequency changer with a mixer and local oscillator. The output of the frequency changer is connected to a first intermediate frequency filter, whose output is connected to a second frequency changer. The output of the frequency changer is connected to the usual second intermediate frequency filter and to an amplitude detector. A reference oscillator is connectable under control of a controller via a multiplexer to the input of the mixer. During an alignment mode of the tuner, the reference signal from the oscillator is supplied to the mixer and the local oscillators and are controlled by the controller to sweep across a frequency range encompassing all possible pass frequencies of the filter. The controller monitors the output of the detector so as to establish the frequency response of the filter. Frequency offsets are then stored in the synthesizers and so as to center each channel during a reception mode on the actual center frequency of the filter.

16 Claims, 2 Drawing Sheets

TUNER AND METHOD OF ALIGNING A TUNER

TECHNICAL FIELD

The present invention relates to a tuner, to a method of aligning a tuner and to a tuner aligned by such a method.

BACKGROUND

Radio frequency tuners for selecting a desired channel for reception within a radio frequency band and converting the channel to a standard intermediate frequency output signal are well known. Such tuners have many applications including receiving signals from cable distribution networks, terrestrial aerials and satellite aerials and are generally of the superheterodyne type. One known type of tuner of the single conversion type performs conversion from the selected channel to the output intermediate frequency in a single frequency conversion step. Another known type of tuner is of the double conversion type and converts the selected channel to a much higher intermediate frequency in a first conversion stage and then to a much lower standard intermediate frequency in a second conversion stage. Tuners having more than two conversion stages are also known.

In a typical known type of multiple conversion tuner such as a double conversion tuner, all of the frequency-selective filtering is performed by one or more fixed filters. Such filters are generally of the bandpass type with fixed centre frequencies and fixed passbands or bandwidths. The input of the first conversion stage receives a broadband signal with little or no band-limit filtering. The first frequency changer performs an up-conversion to a first intermediate frequency which is higher than the input band. The first intermediate frequency is filtered by an intermediate frequency filter with the desired channel centred on the first intermediate frequency.

The filtered signal from the first intermediate frequency filter generally comprises a small number of individual channels which are supplied to a second frequency changer which performs down-conversion to a much lower standard intermediate frequency. The second frequency changer is connected to a second intermediate frequency filter and the conversion is performed such that the selected channel is centred on the second intermediate frequency with the second filter passing the selected channel and substantially rejecting adjacent channels.

The first and second frequency changers each have a local oscillator controlled by a phase locked loop frequency synthesiser. Each channel is selected by appropriately selecting the frequencies of the local oscillators of the first and second frequency changers with the filtering being performed by non-tracking filters of substantially fixed characteristics.

In order to reduce the cost of such tuners, it would be desirable to implement the whole of a tuner in a single monolythic integrated circuit. Although it is possible to embody fixed frequency-selective filters, for example for the first intermediate frequency filter, in such an integrated circuit, it is impossible at present to implement such filters with accurate and repeatable passband centre frequency characteristics so that "single chip" implementations of such tuner architectures have not been possible.

In the case of known tuners provided with discrete or off-chip filters, the filters constitute a substantial percentage of the cost. Thus, multiple conversion architectures have not been economically viable for many low cost systems, such as terrestrial analogue receivers and cable modems which are extremely cost-sensitive.

GB 2 344 710 discloses a technique for aligning a voltage controlled oscillator of a phase locked loop demodulator.

GB 2 244 877 discloses a technique for periodically recalibrating an over-controlled crystal oscillator in an SSB receiver. The receiver is tuned to a frequency standard and the oven temperature is varied so as to vary the frequency of the crystal oscillator. The frequency deviation at the output of the receiver demodulator is monitored so as to establish the crystal oscillator frequency as a function of temperature. From this characteristic, the optimum oven temperature is determined and set. The oscillator frequency is then reset for zero deviation at the detector output.

GB 2 205 460 discloses a technique for the periodic recalibration of a voltage controlled oscillator, for example in a frequency changer of a pager. A temperature compensation function is stored in the form of a look-up table. The output frequency is periodically checked and, if incorrect, a readjustment is performed and the new point value is substituted in the look-up table for future use.

U.S. Pat. Nos. 4,956,711 and 4,736,456 are concerned with providing an automatic alignment or realignment technique for radio frequency filtering ahead of the frequency changer in a television receiver. A signal is injected into the RF stage with a frequency midway between the sound and vision carriers. The IF strip contains a synchronous demodulator whose local oscillator is re-tuned so as to centre the frequency-converted injected signal on the IF pass band. The AGC time constant is reduced so that the AGC circuit can be used to measure the amplitude of the injected signal. The RF filtering is then adjusted so as to maximise the detected injected signal. The technique disclosed in U.S. Pat. No. 4,736,456 makes use of an actual received sound carrier to adjust one of the RF filter sections.

SUMMARY

According to a first aspect of the invention, there is provided a tuner comprising a first frequency changer, having a first local oscillator, and a first intermediate frequency filter for filtering a signal from the first frequency changer, characterised by comprising a detector for detecting the amplitude of a signal filtered by the first filter, a reference oscillator for supplying a reference signal, and a controller arranged, during an alignment mode of the tuner, to supply the reference signal to the first frequency changer, to vary the frequency of at least one of the first local oscillator and the reference oscillator, to monitor the amplitude detected by the detector so as to determine an actual first intermediate frequency of the first filter, and to adjust the first local oscillator so as to convert, during a reception mode of the tuner, each selected channel to the actual first intermediate frequency.

The first filter may be of fixed frequency characteristic.

The first filter may be a bandpass filter.

The reference oscillator may be of fixed frequency.

The controller may be arranged to provide to the first local oscillator an offset adjustment representing the difference between a nominal first intermediate frequency and the actual first intermediate frequency.

The controller may be arranged to vary the frequency of the at least one of the first local oscillator and the reference oscillator so that the signal supplied to the first filter during the alignment mode varies between first and second frequencies which are less than and greater than the lowest and highest pass frequencies, respectively, of the manufacturing tolerance range of the first filter.

The controller may be arranged to perform the alignment mode repeatedly, for example each time the tuner is powered up.

The tuner may comprise a second frequency changer disposed between the first filter and the detector. The controller may be arranged, during the alignment mode, to control a second local oscillator of the second frequency changer so that the detector receives a signal of substantially fixed frequency.

According to a second aspect of the invention, there is provided a method of aligning a tuner of the type comprising a first frequency changer having a first local oscillator and a first intermediate frequency filter for filtering a signal from the first frequency changer, the method comprising supplying a reference signal to the first frequency changer, varying the frequency of at least one of the reference signal and the first local oscillator, monitoring the amplitude of a signal filtered by the first filter to determine an actual first intermediate frequency, and adjusting the first local oscillator so as to convert, during a reception mode of the tuner, each selected channel to the actual first intermediate frequency.

The varying step may comprise varying the frequency of only the first local oscillator.

According to a third aspect of the invention, there is provided a tuner aligned by a method according to the second aspect of the invention.

It is thus possible to provide a technique which permits alignment of a tuner having an intermediate frequency filter whose frequency characteristics may fall within a relatively wide range, in particular as a result of manufacturing tolerances. By adjusting the local oscillator frequency of one or more local oscillators of the tuner in accordance with the filter characteristics determined by this technique, filters which suffer from relatively wide manufacturing tolerances may be used in tuners. Such an arrangement allows a single chip implementation with the whole of a tuner including the frequency filtering embodied within a single monolythic integrated circuit to be provided with a performance which is adequate for good quality reception of radio frequency signals. In the case of tuner architectures which are not fully integrated, this technique allows the use of lower cost discrete filters, such as lumped element or strip line filters, so that the cost of such tuners may be substantially reduced. Such tuners may therefore be used within highly cost-sensitive applications, such as terrestrial analogue receivers and cable modems.

DETAILED DESCRIPTION

Figure 1:
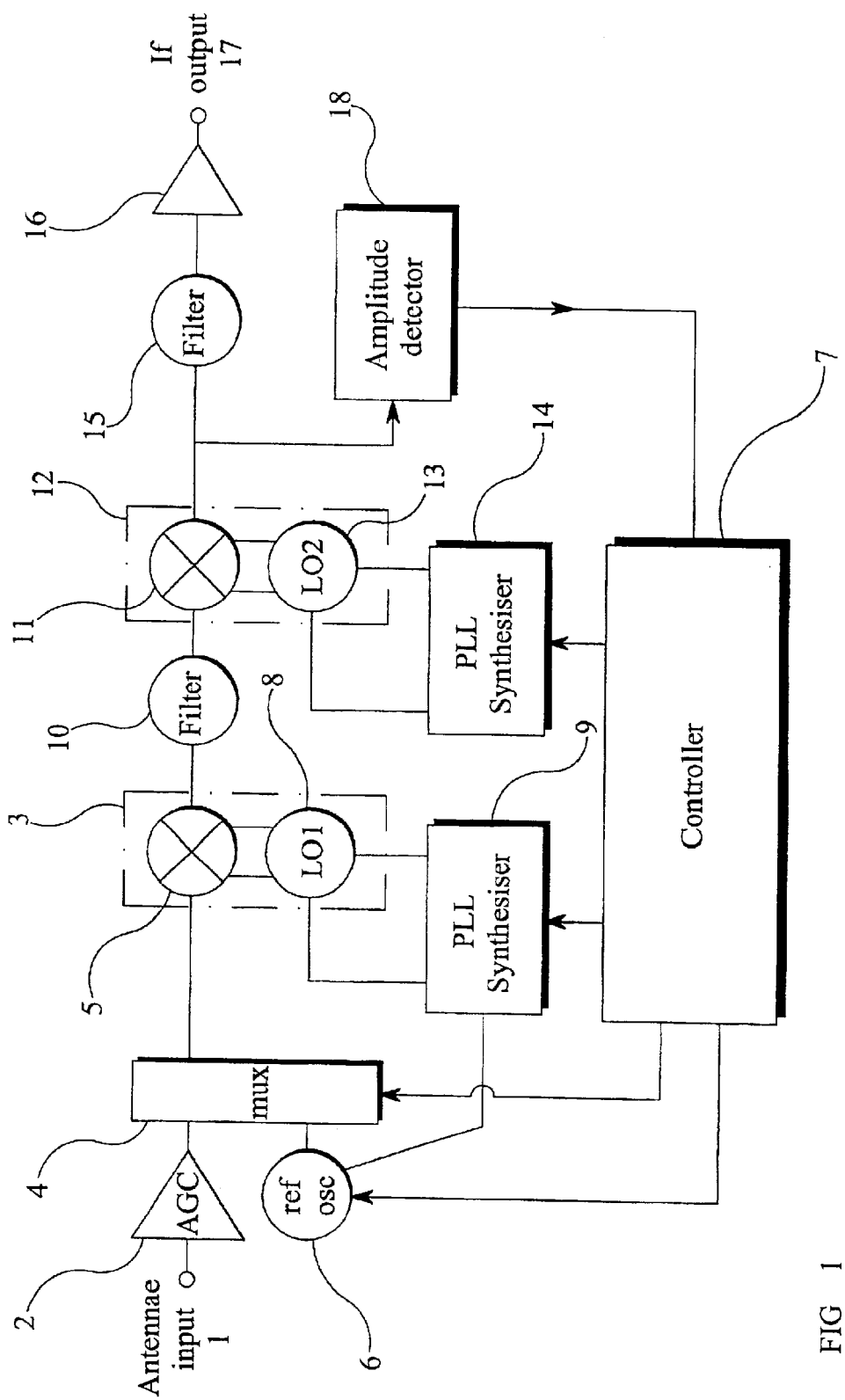
FIG. 1 is a block schematic diagram of a double conversion tuner constituting an embodiment of the invention.

The tuner of FIG. 1 has an input 1 indicated as an antennae input for receiving a broad band radio frequency input. For example, the tuner may be connected to a terrestrial aerial, to a cable distribution network or to a satellite aerial system and may be used for selecting any one of a plurality of channels within a wide reception band.

The input 1 is connected to an automatic gain control (AGC) circuit 2. The circuit 2 controls the signal level at the input of a first frequency changer 3 so as to maximise the signal to intermodulation plus noise performance of the tuner in order to provide acceptable reception. In the tuner illustrated in FIG. 1, there is no frequency filtering between the input 1 and the first frequency changer 3, which therefore receives all signals supplied to the input 1, for example comprising many channels forming a broadband signal of very large frequency width.

The circuit 2 is connected to a first input of a multiplexer (mux) 4 whose output is connected to the input of a mixer 5 of the first frequency changer 3. The multiplexer 4 has a second input connected to receive a reference signal from a reference oscillator 6. The reference oscillator 6 is arranged to provide a reference signal of an accurately known and stable frequency and is switched on and off by a controller 7, which controls all of the functions of the tuner. The controller 7, for example, controls the multiplexer 4 so as to connect the mixer 5 to the output of the circuit 2 during a reception mode of the tuner and to the reference oscillator 6 during an alignment mode of operation of the tuner.

The first frequency changer 3 is arranged to perform a block up-conversion of the received signals and comprises a first local oscillator (LO1) 8 controlled by a phase locked loop (PLL) synthesiser 9. The synthesiser 9 may also be used with the reference oscillator 6, for example by phase-locking the reference oscillator to a divider of the synthesiser 9.

The output of the first mixer 5 is connected to a first intermediate frequency filter 10. The filter 10 has fixed frequency characteristics i.e. it is not of the tuneable or frequency tracking type. However, the filter 10 is of relatively cheap type and is made by a manufacturing process which has large tolerances in performance. In particular, the filter 10 is of bandpass type and has a pass band typically of the order of five channel widths and a centre frequency which may be anywhere within a relatively large tolerance range. Thus, in a typical example, the nominal centre frequency of the passband of the filter 10 is 1220 MHz but the actual centre frequency may be anywhere from 1170 to 1270 MHz.

The output of the filter 10 is connected to the input of a mixer 11 of a second frequency changer 12, which comprises a second local oscillator (LO2) 13 controlled by another PLL synthesiser 14 whose operation is controlled by the controller 7. The second frequency changer 12 performs a down-conversion such that the desired channel is centred on a standard relatively low intermediate frequency, typically of the order of 40 MHz. The output of the second frequency changer 12 is connected to a second intermediate bandpass filter 15 having a pass band substantially equal to the channel width and with a centre frequency centred on the second intermediate frequency. The output of the filter is connected via an intermediate frequency amplifier 16 to an intermediate frequency (IF) output 17 of the tuner. The output of second frequency changer 12 is also connected to the input of an amplitude detector 18 whose output is connected to the controller 7.

The controller 7 may be embodied as a programmed microcontroller or as a state machine. Although the controller 7 and the synthesisers 9 and 14 are shown as separate items in FIG. 1, they may comprise a single controller or the controller 7 may be embodied as part of either or both of the synthesisers 9 and 14.

In a typical tuner, the first intermediate frequency is nominally 1220 MHz and the bandpass filter 10 is intended to have a centre frequency at the nominal intermediate frequency. However, because of manufacturing tolerances in the filter 10, the actual centre frequency of the filter may lie anywhere within a range which can be estimated from the known tolerances of the manufacturing process. Similarly, the passband of the filter 10 may actually lie anywhere within a frequency range approximately centred on the nominal first intermediate frequency of 1220 MHz. By way of example and without loss of generality, in the following description, it will be assumed that the filter passband of all filters manufactured by the manufacturing process will be above 1170 MHz and below 1270 MHz.

The transfer function of the amplitude detector 18 will be at least partially frequency dependent such that signals at the input of the amplitude detector 18 of different frequencies but of the same amplitude may result in different amplitudes being output by the detector 18. In order to account for this, the signal presented to the detector 18 during an alignment mode as described hereinafter should be of a constant frequency. In the following example, it is assumed that this constant frequency is 40 MHz.

Figure 2:
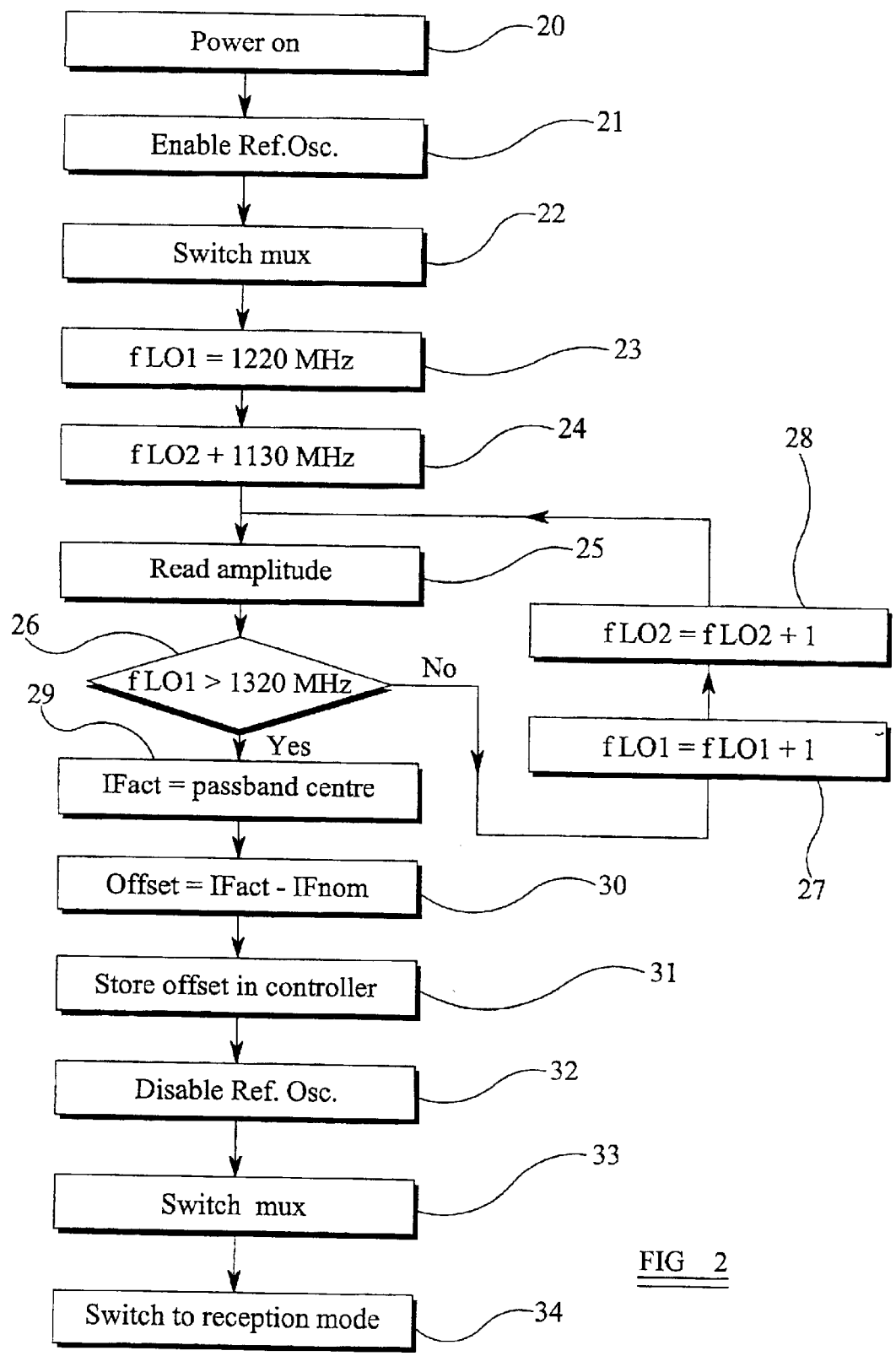
FIG. 2 is a flow diagram illustrating operation of the tuner of FIG. 1.

FIG. 2 illustrates the operation of the tuner as determined by the controller 7 during the alignment mode. In this particular example, the alignment mode is performed each time the tuner is powered up and this is detected in a step 20. A step 21 enables the reference oscillator 6 and a step 22 causes the multiplexer 4 to disconnect the AGC circuit 2 from the input of the mixer 5 and to connect the output of the reference oscillator 6 to the input of the mixer 5. In this example, the reference oscillator 6 supplies a fixed frequency signal at 50 MHz. A step 23 causes the synthesiser 9 to control the local oscillator 8 so that it supplies to the mixer 5 a local oscillator signal of frequency $f_{LO1}=1220$ MHz. The mixer 3 converts the 50 MHz signal from the reference oscillator 6 to a frequency of 1170 MHz and supplies this to the filter 10. In a step 24, the synthesiser 14 controls the local oscillator 13 so that it supplies to the mixer 11 a local oscillator signal of frequency $f_{LO2}=1130$ MHz. Any signal passed by the filter 10 is thus converted by the mixer 11 to a frequency of 40 MHz, which is supplied to the amplitude detector 18.

In a step 25, the controller 7 reads the amplitude as detected by the detector 18 and stores this against the frequency 1170 MHz of the signal supplied to the filter 10. A step 26 then determines whether the first local oscillator frequency $f_{LO1}$ is greater than the upper range of test frequencies, namely 1320 MHz. If so, control passes to a step 29. If not, a step 27 increments the first local oscillator frequency by, in this example, 1 MHz and a step 28 increments the second local oscillator frequency by the same amount so as to ensure that the frequency of the reference signal supplied by the oscillator 6 following frequency conversion by the frequency changers 3 and 12 is of the same frequency, namely 40 MHz, when supplied to the amplitude detector 18. Thus, any variations in the frequency response of the detector 18 do not substantially affect the detected amplitude.

The steps 25 to 28 are repeated with the frequency of the test signal supplied to the filter 10 being incremented by 1 MHz for each cycle of the steps 25 to 28. The controller 7 thus acquires a measure of the actual frequency response of the filter 10 in terms of amplitude of the test signal against frequency throughout the test frequency range of 1170 MHz to 1270 MHz at increments of 1 MHz. In a step 29, the controller determines the actual intermediate frequency $IF_{act}$ of the filter 10 as the centre of the pass band of the filter. For example, if the step 29 determines that the centre of the filter pass band is 1240 MHz, then the actual intermediate frequency of the filter 10 is 20 MHz higher than the nominal first intermediate frequency. A step 30 calculates this offset as the difference between the actual intermediate frequency $IF_{act}$ and the nominal intermediate frequency $IF_{nom}$. The offset is stored in the controller 7 in a step 31 and is used during a subsequent reception mode of the tuner. The alignment mode is completed by disabling the reference oscillator in a step 32 and, and in a step 33, switching the multiplexer 4 so that the reference oscillator is disconnected from the mixer 5 and the output of the circuit 2 is connected to the mixer 5. The tuner is then switched to the reception mode in a step 34.

The synthesisers 9 and 14 are arranged to add the stored offset frequency to the frequencies which they would supply in order to select different channels if the actual first intermediate frequency was equal to the nominal intermediate frequency. Thus, in the first up-conversion performed by the frequency changer 3, each selected channel is centred on the actual centre frequency of the particular example of filter 10 of the tuner and this constitutes the actual first intermediate frequency. Similarly, the second down-conversion performed by the second frequency changer 12 ensures that the selected channel at the actual first intermediate frequency is converted to the nominal second intermediate frequency with the selected channel being centred on the passband of the filter 15. This ensures that the tuner performs correctly irrespective of the actual passband centre frequency of the filter 10 within the range of tolerances of such filters. The tuner can therefore provide adequate performance for the type of modulation of the selected channel with a relatively inexpensive filter 10. It is therefore possible to form the whole of the tuner shown in FIG. 1 on a single monolithic integrated circuit. Alternatively, for discrete embodiments, a relatively inexpensive filter 10 may be used so that this type of tuner may be used in applications which are very cost-sensitive.

It is further possible to perform a similar alignment procedure in respect of the filter 15 if this filter is of the type which is subjected to substantial tolerances in its centre frequency. In this case, during an extension of the alignment mode for the filter 15, the synthesiser 9 is controlled so that the reference oscillator signal is converted to the actual first intermediate frequency. The input of the amplitude detector 18 is connected downstream of the filter 15 and the synthesiser 14 is controlled so as to increment the frequency of the test signal supplied to the filter 15 across the range of possible passband frequencies in accordance with the manufacturing tolerance of the filter 15. The controller 7 thus acquires details of the frequency response of the filter 15, from which it can determine the actual passband centre frequency as the actual second intermediate frequency. The difference between the actual and nominal second intermediate frequencies can then be used as an offset within the synthesiser 14 so that, during the reception mode, each selected channel is centred on the actual second intermediate frequency as described hereinbefore.

As an alternative to the single sweep across the frequency range performed by the steps 25 to 28 in FIG. 2, the controller may be arranged to use successive approximation techniques to determine the pass band centre frequency of the filter and then to tune in either direction so as to characterise the filter response. The centre frequency may then be used as before as the actual first (or second) intermediate frequency.

The tuner illustrated in FIG. 1 is arranged to perform the alignment mode periodically, in particular each time the tuner is powered up. However, it is possible for the alignment mode to be performed only when the tuner is first powered up and this may, for example, take place at or towards the end of manufacture of the tuner. If such an alignment technique is used during manufacture, the technique may be applied to a conventional tuner, for example not having the reference oscillator 6, the controller 7 and the amplitude detector 18. In such a case, an essentially conventional tuner with the or each synthesiser arranged to store the offset may be aligned by an external apparatus comprising the oscillator 6, the controller 7 and the detector 18. The multiplexer 4 would not then be necessary. Instead, at an alignment location, the reference oscillator 6 is connected to the input 1, the amplitude detector 18 to the output of the frequency changer 12, and the controller to the synthesisers 9 and 14 so as to perform the alignment mode and store the offset or offsets in a non-volatile manner in the synthesisers 9 and 14. The tuner may therefore be simpler than that illustrated in FIG. 1. However, an advantage with periodical alignment of the tuner is that any change over a period of time in the frequency characteristics of the filter or filters can be corrected by realignment.

What is claimed is:

1. A tuner comprising a first frequency changer having a first local oscillator, a first intermediate frequency filter for filtering a signal from said first frequency changer, a detector for detecting an amplitude of a signal filtered by said first filter, a reference oscillator for supplying a reference signal, and a controller arranged, during an alignment mode of said tuner, to switch an input of said first frequency changer from receiving a broadcast signal to receiving said reference signal from said reference oscillator, to supply said reference signal to said first frequency changer, to vary a frequency of at least one of said first local oscillator and said reference oscillator, to monitor said amplitude detected by said detector so as to determine an actual first intermediate frequency of said first filter, and to adjust said first local oscillator so as to convert, during a reception mode of said tuner, each selected channel to said actual first intermediate frequency.

2. A tuner as claimed in claim 1, in which said first filter is of fixed frequency characteristic.

3. A tuner as claimed in claim 1, in which said first filter is a bandpass filter.

4. A tuner as claimed in claim 1, in which said reference oscillator is of fixed frequency.

5. A tuner as claimed in claim 1, in which said controller is arranged to provide to said first local oscillator an offset adjustment representing a difference between a nominal first intermediate frequency and said actual first intermediate frequency.

6. A tuner as claimed in claim 1, in which said controller is arranged to vary said frequency of said at least one of said first local oscillator and said reference oscillator so that said signal supplied to said first filter during said alignment mode varies between a first frequency, which is less than a lowest pass frequency of a manufacturing tolerance range of said first filter, and a second frequency, which is greater than a highest pass frequency of said manufacturing tolerance range.

7. A tuner as claimed in claim 1, in which said controller is arranged to perform said alignment mode repeatedly.

8. A tuner as claimed in claim 7, in which said controller is arranged to perform said alignment mode each time said tuner is powered up.

9. A tuner as claimed in claim 1, comprising a second frequency changer disposed between said first filter and said detector.

10. A tuner as claimed in claim 9, in which said second frequency changer has a second local oscillator and said controller is arranged, during said alignment mode, to control said second local oscillator so that said detector receives a signal of substantially fixed frequency.

11. A method of aligning a tuner of the type comprising a first frequency changer having a first local oscillator and a first intermediate frequency filter for filtering a signal from said first frequency changer, said method comprising the steps of: switching an input of said first frequency changer from receiving a broadcast signal to receiving a reference signal, supplying said reference signal to said first frequency changer; varying a frequency of at least one of said reference signal and said first local oscillator; monitoring an amplitude of a signal filtered by said first filter to determine an actual first intermediate frequency; and adjusting said first local oscillator so as to convert, during a reception mode of said tuner, each selected channel to said actual first intermediate frequency.

12. A method as claimed in claim 11, in which said varying step comprises varying said frequency of only said first local oscillator.

13. A method as claimed in claims 11, in which said first local oscillator is provided with an offset adjustment representing a difference between a nominal first intermediate frequency and said actual first intermediate frequency.

14. A method as claimed in claim 11, in which said frequency of said at least one of said first local oscillator and said reference signal is varied so that said signal supplied to said first filter during said alignment mode varies between a first frequency, which is less than a lowest pass frequency of a manufacturing tolerance range of said first filter, and a second frequency, which is greater than a highest pass frequency of said manufacturing tolerance range.

15. A method as claimed in claim 11, in which said tuner comprises a second frequency changer having a second local oscillator, said amplitude of said signal is monitored after said second frequency changer, and a frequency of said second local oscillator is controlled so that said signal whose amplitude is monitored is of substantially fixed frequency.

16. A tuner aligned by a method as claimed in claim 11.

* * * * *